United States Patent
Kim et al.

(10) Patent No.: US 7,560,712 B2
(45) Date of Patent: Jul. 14, 2009

(54) ION IMPLANTER WITH ETCH PREVENTION MEMBER(S)

(75) Inventors: Il-Kyoung Kim, Seoul (KR); No-Hyun Huh, Gyeonggi-do (KR); Tae-Won Lee, Gyeonggi-do (KR); Sung-Wook Park, Gyeonggi-do (KR); Ki-Young Yun, Gyeonggi-do (KR); Won-Soon Lee, Gyeonggi-do (KR); Young-Ha Yoon, Gyeonggi-do (KR); Tae-Sub Im, Gyeonggi-do (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 17 days.

(21) Appl. No.: 11/845,187

(22) Filed: Aug. 27, 2007

(65) Prior Publication Data
US 2008/0054194 A1 Mar. 6, 2008

(30) Foreign Application Priority Data
Aug. 30, 2006 (KR) .................. 10-2006-0082659

(51) Int. Cl.
*H01J 37/317* (2006.01)
*H01J 37/305* (2006.01)

(52) U.S. Cl. .................. 250/492.21; 250/492.2; 250/492.3; 156/345.39; 438/513

(58) Field of Classification Search .......... 250/492.21, 250/492.2, 492.3; 156/345.39; 438/513
See application file for complete search history.

(56) References Cited

U.S. PATENT DOCUMENTS

| | | | |
|---|---|---|---|
| 6,537,429 | B2 | 3/2003 | O'Donnell et al. |
| 6,893,907 | B2 * | 5/2005 | Maydan et al. ............ 438/149 |
| 7,037,813 | B2 * | 5/2006 | Collins et al. ............ 438/510 |
| 2005/0150861 | A1 * | 7/2005 | Lee et al. ............ 216/2 |

FOREIGN PATENT DOCUMENTS

| | | |
|---|---|---|
| JP | 03255622 | 11/1991 |
| JP | 2001179080 | 7/2001 |

\* cited by examiner

*Primary Examiner*—Nikita Wells
(74) *Attorney, Agent, or Firm*—Volentine & Whitt, PLLC

(57) ABSTRACT

An apparatus and method of doping ions into a substrate are disclosed and include a process chamber having an inner space in which an ion implantation process is performed, a support unit positioned in the process chamber, supporting a substrate and being electrically connected to a first power source for generating a high frequency pulse, a conductive unit separated from the support unit in such a manner that plasma associated with the ion implantation process is generated between the support unit and the conductive unit, wherein the conductive unit comprises a first etch prevention member preventing the conductive unit from being etched by a source gas used to generate the plasma, and a power port electrically connected to a second power source and generating radio frequency (RF) power applied to the conductive unit.

31 Claims, 5 Drawing Sheets

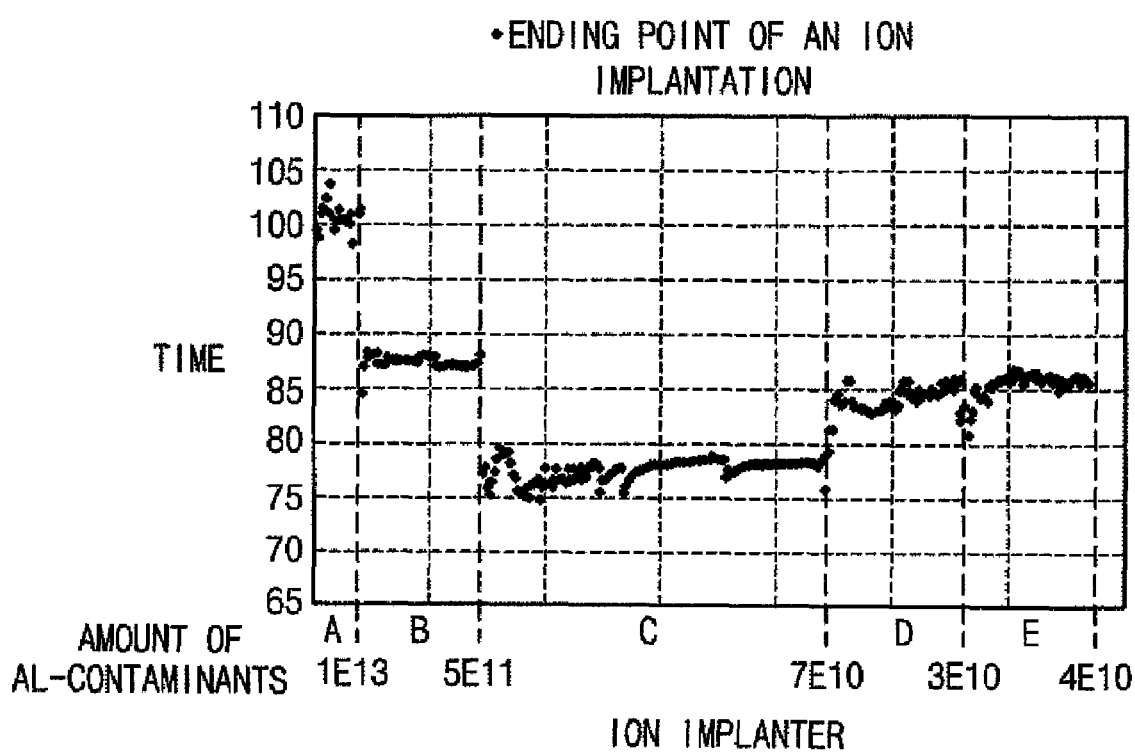

# ION IMPLANTER WITH ETCH PREVENTION MEMBER(S)

CROSS REFERENCES TO RELATED APPLICATIONS

This application claims priority under 35 U.S.C. § 119 to Korean Patent Application No. 2006-82659, filed on Aug. 30, 2006, the subject matter of which is hereby incorporated by reference.

BACKGROUND OF THE INVENTION

1. Field of the Invention

The present invention relates to an apparatus and method of doping ions into a substrate for use in the fabrication of semiconductor devices. More particularly, the invention relates to a doping apparatus having a process chamber with inner surfaces resistant to etching by processing gases and a doping method using the same.

2. Description of the Related Art

A semiconductor device is generally manufactured through a plurality of sequentially and selectively repeated unit processes such as a deposition process, an etching process, an ion implantation process, a polishing process, a cleaning process and a drying process. Among the above unit processes, the ion implantation process generates an ion beam that implants p-type or n-type impurities onto a substrate. The selective implantation of ions may be used to control the resistivity characteristics of the substrate. P-type impurities generally include an element having five-valence-electron atoms, such as boron (B), aluminum (Al) or indium (In), and the n-type impurities include an element having three-valence-electron atoms, such as antimony (Sb), phosphorus (P) or arsenic (As).

A doping process such as an ion implantation is designed to change the physical and electrical properties of the substrate by implanting a defined quantity of impurity ions into the substrate at a desired depth. Thermal diffusion is commonly used as part of an ion implanting process. However, the accuracy with which impurity ions may be directly implanted into the substrate by the ion beam during an implantation process is much greater than that of a subsequently performed thermal diffusion process. This is particularly so for a plasma ion implantation which may be used to form very fine implantation patterns in contemporary semiconductor devices. The plasma ion implantation process is able to achieve this accuracy because the exact implantation depth may be determined by controlling the voltage generating plasma in a constituent process chamber instead of controlling the energy level of an ion beam used to accelerate impurity ions into the substrate.

Figure (FIG.) 1 illustrates the general configuration of a conventional plasma ion implantation apparatus 90. Referring to FIG. 1, apparatus 90, commonly referred to as a plasma ion implanter includes a process chamber 10 formed by chamber walls 14. Process chamber 10 includes a port 12 for loading/unloading a wafer to/from process chamber 10. Chamber walls 14 may be formed from a bulk-aluminum (Al) body without a liner, so as to function as a conductive electrical ground.

A connection port 14a is disposed on an upper portion of chamber walls 14 and may include a coil through which radio frequency (RF) power is supplied to process chamber 10. Connection port 14a is connected to a second power source 60 supplying electrical power to the upper portion of process chamber 10. Second power source 60 may include an RF generator 62 generating RF power and an impedance matching transformer 64 connected to RF generator 62. Connection port 14a may be formed through chamber walls 14 and may comprise aluminum oxide (Al2O3) in order to be electrically insulated from the conductive surroundings, and yet provide sufficient resistant to a cleaning solution of nitrogen trifluoride (NF3) which is commonly used to clean process chamber 10.

A support unit 20 is positioned on a bottom portion of process chamber 10, and a wafer W is secured on support unit 20. Support unit 20 includes a platen 22 holding the wafer W, a platen bushing 24 enclosing platen 22 and isolating platen 22 from processing gases introduced into process chamber 10, a shield ring 26 positioned over platen 22 and platen bushing 24, and a clamp (not shown) securing a peripheral portion of the wafer W to the upper surface of platen 22.

The bottom surface of platen 22 is electrically connected to a first power source 28 so that electrical power may be supplied to process chamber 10 during an ion implantation process. More particularly, first power source 28 applies a high-voltage pulse to platen 22 W such that platen 22 and mounted wafer W function as a cathode during the ion implantation process.

The top surface of platen bushing 24 is coplanar with the flat top surface of platen 22 and encloses platen 22. Platen bushing 24 may be formed from aluminum oxide (Al2O3) like connection port 14a such that platen bushing 24 is electrically insulated from the surrounding conductive elements and sufficiently resistant to a cleaning solution of nitrogen trifluoride (NF3). In this manner, platen 22 may be protected from the processing gases and/or cleaning gases introduced into process chamber 10.

A baffle 30 is arranged at an upper portion of process chamber 10 and is spaced apart from platen 24 by a predetermined distance. Baffle 30 is electrically grounded such that secondary ions generated during the ion implantation process may be discharged through baffle 30. Baffle 30 may be formed from a highly conductive metal such as aluminum (Al). A plurality of cooling tubes may be associated with baffle 30 such that baffle 30 doe not become excessively heated during the ion implantation process. Baffle 30 functions as an anode during the ion implantation process.

An upper portion of process chamber 10 allows the introduction of gases and is connected to a gas supply unit 40. Gas supply unit 40 includes a gas source 42 holding the doping gas(es) used during the ion implantation process, and a flow controller 44 controlling the flow of gas(es) including one or more source gas(es) into process chamber 10. Examples of the source gas include phosphine (PH3), arsine (AsH3) and diborane (B2H6).

A discharge unit 50 is positioned at the bottom portion of process chamber 10, and when operated, extracts gases within process chamber 10 in order to exhaust such gases or create a vacuum environment.

An exemplary operation of ion implanter 90 will now be described. A semiconductor wafer W is loaded onto the upper surface of platen 22 through port 12 of process chamber 10. Then, a source gas which will be changed into implantation ions is introduced into process chamber 10. A high voltage pulse is applied to platen 22 by first power source 28 and RF power is applied to baffle 30 by second power source 60. As a result, discharge plasma is generated between baffle 30 and platen 22. In particular, a plasma sheath is generated around an upper surface of the wafer W. The RF power is continuously applied to baffle 30 by second power source 60 and the discharge plasma is continuously generated between baffle 30 and platen 22. Due to the high voltage pulse is applied to platen 22 on which the wafer W is mounted, positive ions from the discharge plasma are accelerated towards wafer W. The resulting acceleration is proportional to the voltage difference between platen 22 and baffle 30, and the implantation depth is proportional to the acceleration velocity of the positive ions from the discharge plasma. Accordingly, a shallow junction area may be formed in upper surface portions of the wafer W by controlling the voltage difference between platen 22 and baffle 30.

However, the bulk aluminum (Al) and/or the aluminum oxide (Al2O3) materials forming the foregoing elements of ion implanter 90 are directly exposed to the source gas introduced into process chamber 10 as well as any reactive by-products. Thus, the inner surfaces of chamber walls 14, connection port 14a, side surfaces of baffle 30 and platen bushing 24, collectively but not exclusively comprising the "inner surfaces of process chamber 10", are exposed to potentially corrosive gases.

When the source gas includes one or more hydrogen-based gases, which generally have deposition properties that are relatively superior to etching properties, is introduced into process chamber 10, it minimally reacts with the bulk aluminum (Al) and/or aluminum oxide (Al2O3) forming the inner spaces of process chamber 10 during the ion implantation process. As a result, minimal contamination of the inner surfaces results during the ion implantation process.

However, when the source gas including fluorine-based gases, such as boron trifluoride (BF3), which has etching properties relatively superior to deposition properties, is introduced into process chamber 10, the source gas readily reacts with the bulk aluminum (Al) and/or aluminum oxide (Al2O3) forming the inner surfaces of process chamber 10 during the ion implantation process. The resulting formation of contamination on the inner surfaces may subsequently generate defects in wafers being processed in process chamber 10.

In order to decrease the processing defects caused by these contaminants, a protection layer is formed on the inner surfaces of the process chamber prior to performing an ion implantation process that uses a fluorine-based gas. For example, a diborane (B2H6) layer or a silicon dioxide (SiO2) layer may be formed on the inner surfaces prior to performance of an ion implantation process using a fluorine-based gas. Unfortunately, the formation of the protection layer requires time and resources better used in the actual fabrication of semiconductor devices, and often does not adequately cover the inner surfaces of process chamber 10.

Indeed, experimental data suggests that the formation process of a protection layer takes almost as long as the actual ion implantation process. Thus, the efficiency of fabrication processing at process chamber 10 drops by about 50% when a protection layer is incorporated. This drop in throughput efficiency is particularly notable since conventional ion implantation processes are usually performed for lots of 25 wafers. Since ion implantation is performed serially for the 25 wafers, the incorporation of a protection layer for each ion implantation process is a significant overhead commitment.

Experimental data also suggests that the reduction in Al contaminants caused by the ion implantation process is not materially reduced by a protection layer, since its coverage of the inner surfaces of process chamber 10 is not complete. This is particularly true for serial batch processing of multiple wafers between cleaning cycles.

Table 1 shows an accumulated amount of Al contaminants detected on the surface of test wafers during a batch sequence of ion implantation processes.

TABLE 1

| Wafer Number | Amount of Al contaminants (E10 atoms/cm2) |
|---|---|
| Wafer 1 | 0.01 |
| Wafer 2 | 1,070 |
| Wafer 3 | 145.3 |
| Wafer 4 | 886.7 |
| Wafer 5 | 1,283 |

Each wafer in Table 1 underwent ion implantation process at a dosage of about 2E15 at an electrical power level of about 7 kV using boron trifluoride (BF3) gas as a source gas. Further, a protection layer was formed on the inner surfaces of process chamber 10 prior to the sequence of ion implantation processes using argon (Ar) gas and diborane (B2H6) gas. Wafer 1 was the first wafer undergoing the ion implantation process following formation of the protection layer on the inner surfaces of process chamber 10. Wafer 2 was the 25$^{th}$ wafer undergoing the ion implantation process. Following the processing of Wafer 2, a second protection layer was formed on the inner surfaces of process chamber 10. Wafer 3 was the first wafer undergoing the ion implantation process following formation of the second protection layer on the inner surfaces of process chamber 10. Wafer 4 was the 25$^{th}$ wafer undergoing the ion implantation process following formation of the second protection layer on the inner surfaces of process chamber 10. Wafer 5 was the 40$^{th}$ wafer undergoing the ion implantation process following formation of the second protection layer on the inner surfaces of process chamber 10. The amount of accumulated Al contaminants on the surface of each wafer was measured by inductively coupled plasma mass spectrometry (ICP-MS). Referring to Table 1, the increasing amount of accumulated Al contaminants clearly indicates inadequate coverage of the inner surfaces of process chamber 10 by either the first or second protection layers.

FIG. 2 is a graph showing the amount of Al contaminants on the surface of respective wafers in a batch of wafers undergoing an ion implantation process. Here again, the amount of Al contaminants was measured using surface secondary ion mass spectrometry (surface SIMS). The horizontal axis indicates a sequential wafer number and the vertical axis indicates the measured amount of Al contaminants expressed in atoms per cubic centimeter of the wafer surface.

A first protection layer was formed on the inner surfaces of process chamber 10 prior to processing of Wafer 1 and a second protection layer was formed prior to processing Wafer 26. In this regard, Wafers 1-25 were subjected to a first ion implantation process and Wafers 26-49 were subjected to a second ion implantation process.

Referring to FIG. 2, the amount of measured Al contaminants increases almost linearly during the sequence of implantation processes. Furthermore, the resulting increase in Al contaminants in the first ion implantation process is almost the same as that in the second ion implantation process. That is, FIG. 2 shows that the increase in Al contaminants on a surface of wafers being processes is substantially the same for different ion implantation processes uses similarly contaminating gas components.

As indicated by the results shown in Table 1 and FIG. 2, the use of a protection layer is inadequate to prevent the formation of Al contamination on the inner surfaces of process chamber 10 when one or more fluorine-based gas(es) is used as the source gas for the ion implantation process. And this result arises after the process efficiency hit required to form the protection layer prior to performing the ion implantation process.

SUMMARY OF THE INVENTION

An embodiment of the invention provides an apparatus for doping ions into a substrate including a process chamber having inner surfaces that are etch-resistant to one or more caustic source gas(es) without the requirement of forming a protection layer.

Another embodiment of the invention provides a method of doping ions into a substrate using the above doping apparatus.

In one embodiment, the invention provides a doping apparatus comprising: a process chamber having an inner space in which an ion implantation process is performed, a support unit positioned in the process chamber, supporting a substrate and being electrically connected to a first power source for generating a high frequency pulse, a conductive unit separated from the support unit in such a manner that plasma associated with the ion implantation process is generated between the support unit and the conductive unit, wherein the conductive unit comprises a first etch prevention member preventing the conductive unit from being etched by a source gas used to generate the plasma, and a power port electrically connected to a second power source and generating radio frequency (RF) power applied to the conductive unit.

In another embodiment, the invention provides a doping apparatus comprising: a process chamber having an inner space in which an ion implantation process is performed and comprising a first etch prevention member preventing the process chamber from being etched by a source gas associated with the ion implantation process, a support unit positioned in the process chamber, supporting a substrate, and being electrically connected to a first power source for generating a high frequency pulse, a conductive unit separated from the support unit across the inner space and comprising a second etch prevention member preventing the conductive unit from being etched by the source gas, and a power port electrically connected to a second power source generating RF power applied to the conductive unit and comprising a third etch prevention member preventing the power port from being etched by the source gas. In still another embodiment, the invention provides a method of doping ions into a substrate. A process chamber having an inner space is prepared and a doping process is performed in the inner space. The process chamber includes a conductive unit having a first etch prevention member and electrically connected to a first power source for generating radio frequency (RF) power, and a support unit having a second etch prevention member at a peripheral portion thereof and electrically connected to a second power source for generating a high frequency pulse. The process chamber has a third etch prevention member along a body wall that defines the inner space therein. The inner space of the process chamber is formed to be vacuous by discharging gas and byproducts in the process chamber through an exhaust unit. Then, the substrate is loaded onto the support unit, and a source gas is introduced into the inner space of the process chamber. RF power is applied to the conductive unit and the high frequency pulse is applied to the support unit, so that the source gas is transformed into plasma and doped into the substrate without an etching against the body wall of the process chamber, the conductive unit and the support unit. The body wall of the process chamber may further include a power port that is electrically connected to the first power source and has a fourth etch prevention member, so that the power port is prevented from being etched in the doping process.

BRIEF DESCRIPTION OF THE DRAWINGS

FIG. 5 is a graph showing the amount of the Al contaminants measured within various ion implanters.

DESCRIPTION OF THE EMBODIMENTS

Figure 1:
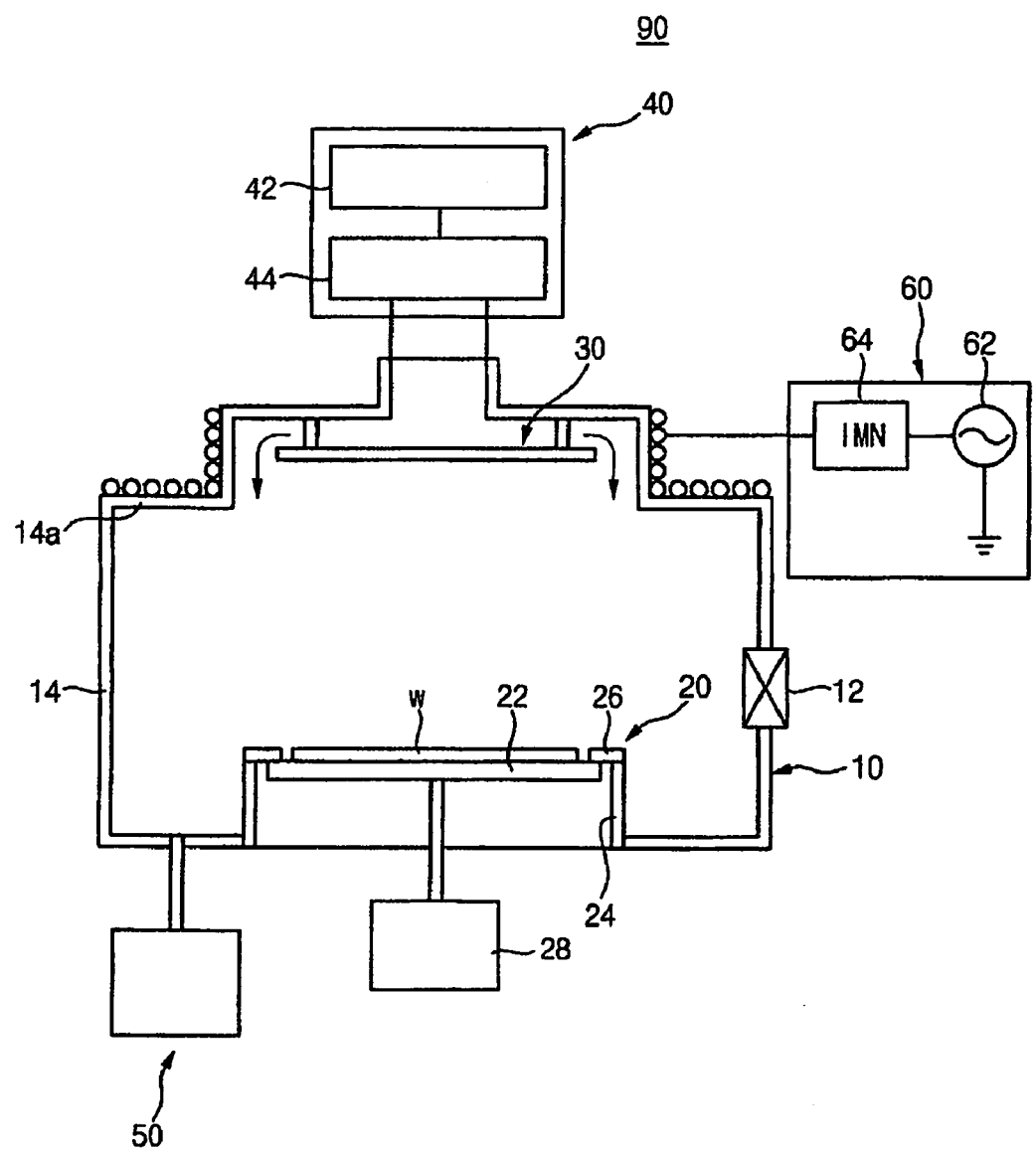
FIG. 1 is a view illustrating the configuration of a conventional apparatus for a plasma ion implantation.
Figure 2:
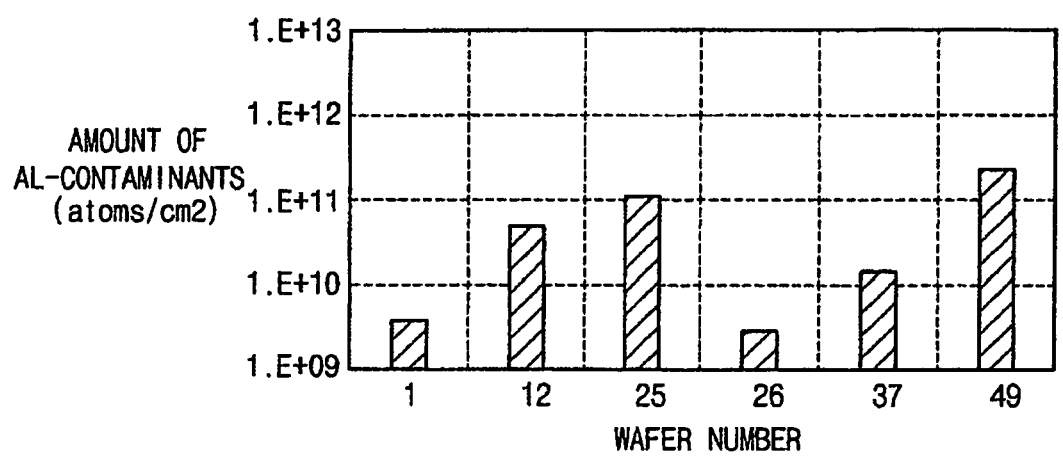
FIG. 2 is a graph showing the amount of the aluminum (Al) contaminants on wafers sequentially undergoing ion implantation.

Embodiments of the invention will be described with reference to the accompanying drawings. The invention may, however, be embodied in many different forms and should not be construed as limited to only the illustrated embodiments. Throughout the drawings and the written description, like reference numbers are used to indicate like or similar elements. In the drawings, the size and relative sizes of various elements may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 3:
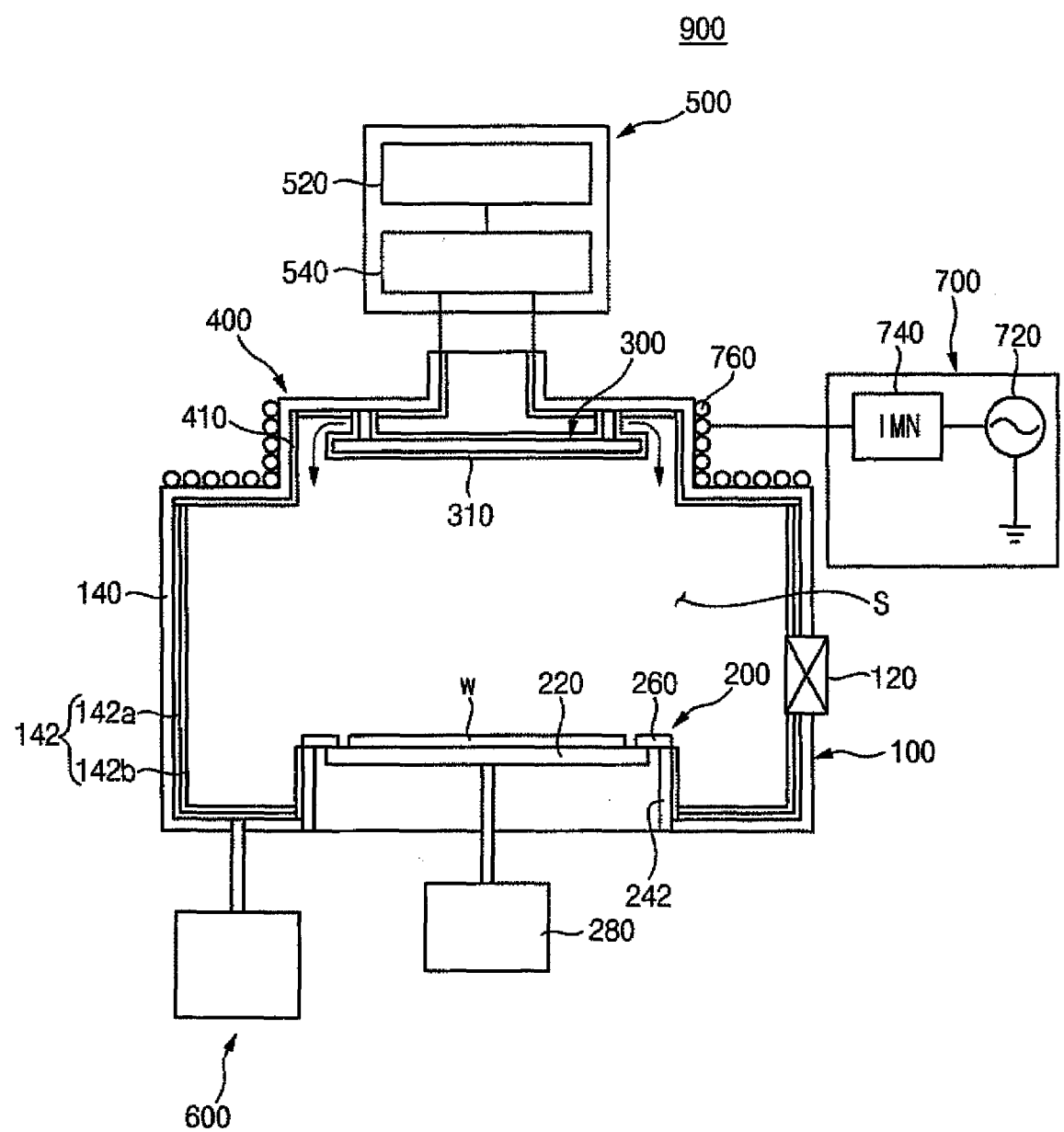
FIG. 3 is a view illustrating an exemplary configuration of an ion implanter according to an embodiment of the invention.

FIG. 3 is a view illustrating the configuration of an ion implanter 900 according to an example embodiment of the invention.

Referring to FIG. 3, ion implanter 900 includes a process chamber 100 providing an inner space "S" in which an ion implantation process is performed, a support unit 200 positioned in process chamber 100 and adapted to support a substrate W, a conductive unit 300 separated from support unit 200 across inner space S, and a power port 400 adapted apply radio frequency power (RF) to process chamber 100.

Process chamber 100 includes a port 120 for loading/unloading the substrate W to/from process chamber 100, a body wall 140 defining the overall physical shape of process chamber 100, and a first etch prevention member 142 preventing body wall 140 from being etched.

Inner space S of process chamber 100 provides a place in which the plasma for the ion implantation may be generated. A vacuum may be formed in inner space S using a conventional control system. In one embodiment, inner space S of process chamber 100 is held at a pressure of about 1 mTorr to about 500 mTorr. Then, a source gas, which may include a mixture of gases, associated with the ion implantation process, is introduced into process chamber 100 and RF power is applied. Thus, a discharge plasma is generated in inner space S of process chamber 100. In one embodiment, the source gas includes a fluorine-based gas such as boron trifluoride (BF3) as well as a hydrogen-based gas such as phosphine (PH3), arsine (AsH3) and diborane (B2H6).

In the illustrated embodiment, port 120 is disposed through a portion of body wall 140 and functions as a gateway for connecting the inner space S of process chamber 100 to the external surroundings. Hence, port 120 will typically includes a decompression system (not shown) allowing a vacuum to be developed in inner space S.

In one embodiment, it is assumed that body wall 140 is formed from aluminum (Al) or an aluminum alloy and is electrically grounded. A first etch prevention member 142 is configured on the inner surface of body wall 140 and is adapted to prevent the etching of body wall 140 even in the presence of one or more fluorine-based gases.

In one embodiment, first etch prevention member 142 includes a liner 142a associated with body wall 140 and a thin layer 142b formed on liner 142a. Liner 142a may be formed from aluminum (Al) and thin layer 142b may be formed from a superior etch-resistant material such as silicon (Si), yttrium oxide ($Y_2O_3$) and an anodized oxide. The anodized oxide and yttrium oxide have good etch-resistance qualities relative to nitrogen trifluoride ($NF_3$) gas which is commonly used as a cleaning gas related to the ion implantation process. However, the anodized oxide and yttrium oxide provide very poor electrical ground connection.

As an alternative to silicon (Si), first etch prevention layer 142 may include Kapton™ tape, an industrial plastic products manufactured by Dupont Corporation, comprising a polyimide. Kapton tape may be easily installed and removed from the inner surfaces of process chamber 100. That is, Kapton tape may be easily molded around the complex shape of body wall 142.

Support unit 200 includes a platen 220 holding the substrate W, a platen bushing 240 enclosing the periphery of platen 220, a shield ring 260 positioned on the periphery of platen 220 and platen bushing 240, and a damper (not shown) securing an outer edge of substrate W to the flat upper surface of platen 220. Platen bushing 240 isolates platen 220 from the source gas introduced into process chamber 100 and secures platen 220 to process chamber 100.

In the illustrated embodiment, platen 220 is positioned at a lower portion of process chamber 900. A lower surface of platen 220 is electrically connected to a first power source 280. When first power source 280 applies a high voltage pulse to platen 220 and mounted substrate W, platen 200 functions as a cathode during the ion implantation process. For example, first power source 280 may apply a pulsed electrical energy for about 1 microsecond to about 50 microseconds at a voltage of about 1 kV to about 10 kV and a frequency of about 100 Hz to about 2 kHz. However, the exact power conditions will vary in accordance with the nature of the ion implantation process being performed.

Platen bushing 240 encloses platen 220 is generally coplanar with the upper surface of platen 220. In one embodiment, platen bushing 240 is formed from aluminum oxide ($Al_2O_3$) having good electrical isolation properties and a superior etch resistance to a cleaning gas including nitrogen fluoride ($NF_3$) gas. In this manner, platen 220 is protected from the source gas and the cleaning gas associated with the ion implantation process. A second etch prevention member 242 may be positioned on platen bushing 240 in order to prevent platen bushing 240 from being etched by the source gas introduced into process chamber 100.

In one embodiment, second etch prevention member 242 includes a liner associated with platen bushing 240. Second etch prevention member 242 may include a liner formed from quartz or Teflon and configured along a surface of platen bushing 240, or from a diamond-like carbon (DLC) layer. The etch resistance of the quartz liner to nitrogen fluoride ($NF_3$) gas will vary with thickness. Thus, an optimum thickness for the quartz liner may be determined in accordance with an expected amount of the nitrogen fluoride ($NF_3$) gas. The DLC layer has good hardness and electrical characteristics hardly related to its carbon (C) characteristics. In one embodiment, second etch prevention member 242 includes a quartz liner which has been shown to sufficiently protect platen bushing 240 from being etched by the source gas introduced during the ion implantation process.

Shield ring 260 is positioned on the periphery portion of platen 220 and on platen bushing 240, such that the effective area of the ion implantation process is enlarged to an extent greater than the surface area of the substrate W. An inner surface of shield ring 260 has a shape fitted to the outer edge of substrate W and may be formed from the same material as the substrate W (e.g., silicon). Accordingly, when substrate W is positioned on platen 220, it is securely seated within shield ring 260 in manner that allows the bulk material of substrate W and shield ring 260 to be treated as a common process object for the ion implantation process. As a result, the ion implantation process is performed over an upper surface of a common process object that is greater than the upper surface of the substrate W alone. As a result, implantation uniformity may be markedly improved. The substrate W may be secured to the upper surface of platen 220 by the clamper. The damper may be formed with a mechanical and/or electrical structure such that it serves as a conventional electrostatic chuck.

Conductive unit 300 is separated by inner space S from platen unit 200. For example, if platen 200 is positioned at a lower portion of process chamber 100, conductive unit 300 may be positioned at an upper portion. A plurality of cooling tubes (not shown) is positioned in relation to conductive unit 300, such that conductive unit 300 does not overheat during the ion implantation process.

In one embodiment, conductive unit 300 is formed from aluminum (Al) and is electrically grounded through connection to process chamber 100. In the illustrated embodiment, conductive unit 300 is shaped as a baffle, such that secondary ions generated during ion implantation may be absorbed into conductive unit 300 and discharged through conductive unit 300.

In the illustrated embodiment, conductive unit 300 includes a third etch prevention member 310 preventing etching of conductive unit 300 by the source gas introduced into process chamber 100. In one embodiment, third etch prevention member 310 includes a silicon plate adhered to the exposed surfaces of conductive unit 300. The silicon plate may comprise a silicon-based material including one or more materials of p-type conductivity, such as aluminum (Al) particles. However, the overall electrical properties of the silicon plate may be controlled in view of the anticipated processing characteristics associated with the ion implantation process.

Although the silicon-based material layer may be readily formed on the surface of conductive unit 300, its electrical conductivity will be inferior to that of aluminum (Al) particles, and its etch resistance to nitrogen fluoride ($NF_3$) may be unsatisfactory.

Thus, third etch prevention member 310 may alternately or additionally include a diamond-like carbon (DLC) layer or a graphite layer formed on the surface of conductive unit 300. The DLC or graphite layer has good conductivity and high hardness despite difficulties associated with forming it on conductive unit 300. Accordingly, the DLC or graphite layer may be used in a precise ion implantation process at the expense of the process efficiency.

Conductive unit 300 cooperates in the generation of plasma in inner space S by electrical interaction with platen 220. That is, conductive unit 300 functions as an anode and to platen 220 cathode in the formation of plasma, such that the source gas introduced into process chamber 100 is transformed into plasma by the high voltage field (e.g. an RF power field) between the anode and the cathode.

High voltage power may be applied to process chamber 100 through a power port 400. Power port 400 may be integrally formed in body wall 140 and electrically connected to second power source 700 from which the RF power is generated.

In one embodiment, power port 400 comprises aluminum oxide ($Al_2O_3$) having a good isolation characteristic and superior etch resistance to nitrogen fluoride ($NF_3$). An outer surface of power port 400 makes contact with a power coil 760 through which the RF power is supplied from second power source 700. A fourth etch prevention member 410 is positioned on the inner surface of power port 400 and prevents etching of power port 400 by the source gas introduced into process chamber 100.

Second power source 700 includes an RF power generator 720 for generating the RF power, an impedance matching transformer 740 electrically connected to RF power generator 720, and an induction coil 760 inducing the impedance-matched RF power into the inner space S of process chamber 100. For example, the RF power generator 720 may generate an RF power level of about 3.3 kW at a frequency of about 2 MHz.

Fourth etch prevention member 410 may include a liner associated with power port 400. The liner of fourth etch prevention member 410 may comprise silicon, quartz or aluminum nitride (AlN). In one particular embodiment, a quartz liner may have the same dielectric constant as power port 400. The quartz liner may be easily formed on power port 400 and molded to the complex shape of process chamber 100. Pure aluminum has about half the etch rate as aluminum oxide, so an aluminum liner will have superior etch resistance relative to an aluminum oxide liner. In contrast, the silicon liner may depend on electromagnetic characteristics of the plasma in inner space S.

Fourth etch prevention member 410 may include a thin layer formed on the surface of power port 400. The thin layer may comprise yttrium oxide (Y2O3), pour-free aluminum oxide ($Al_2O_3$) or silicon (Si). A yttrium oxide layer will have good etch resistance during an in-situ cleaning process using a polymer and nitrogen fluoride ($NF_3$) gas. In contrast, the silicon layer has inferior etch resistance with respect to a cleaning gas including nitrogen fluoride ($NF_3$) gas.

The upper surface of process chamber 100 may be partially opened to allow connection of a gas supply unit 500. In the illustrated embodiment, gas supply unit 500 includes a reservoir 520 holding the source gas and a mass flow controller 540 connected to reservoir 520 and controlling the flow of source gas to process chamber 100.

As shown in the illustrated embodiment, gas supply unit 500 is positioned over of process chamber 100, and the source gas is supplied to an upper surface of conductive unit 300. The source gas diffuses over the upper surface of conductive unit 300 to be uniformly supplied to the inner space S along an upper portion of body wall 140.

An exhaust unit 600 is positioned at a bottom portion of process chamber 100. Gas and by-products contained in inner space S may be discharged from process chamber 100 through exhaust unit 600. Further, exhaust unit 600 may be used to develop a vacuum in process chamber 100. In one embodiment, exhaust unit 600 may include a control valve (not shown) and a vacuum pump (not shown) coupled to the control valve. When an ion implantation process is completed, the source gas and plasma in inner space S may be discharged from process chamber 100 in order to maintain or re-develop a vacuum state in process chamber 100.

Figure 4:
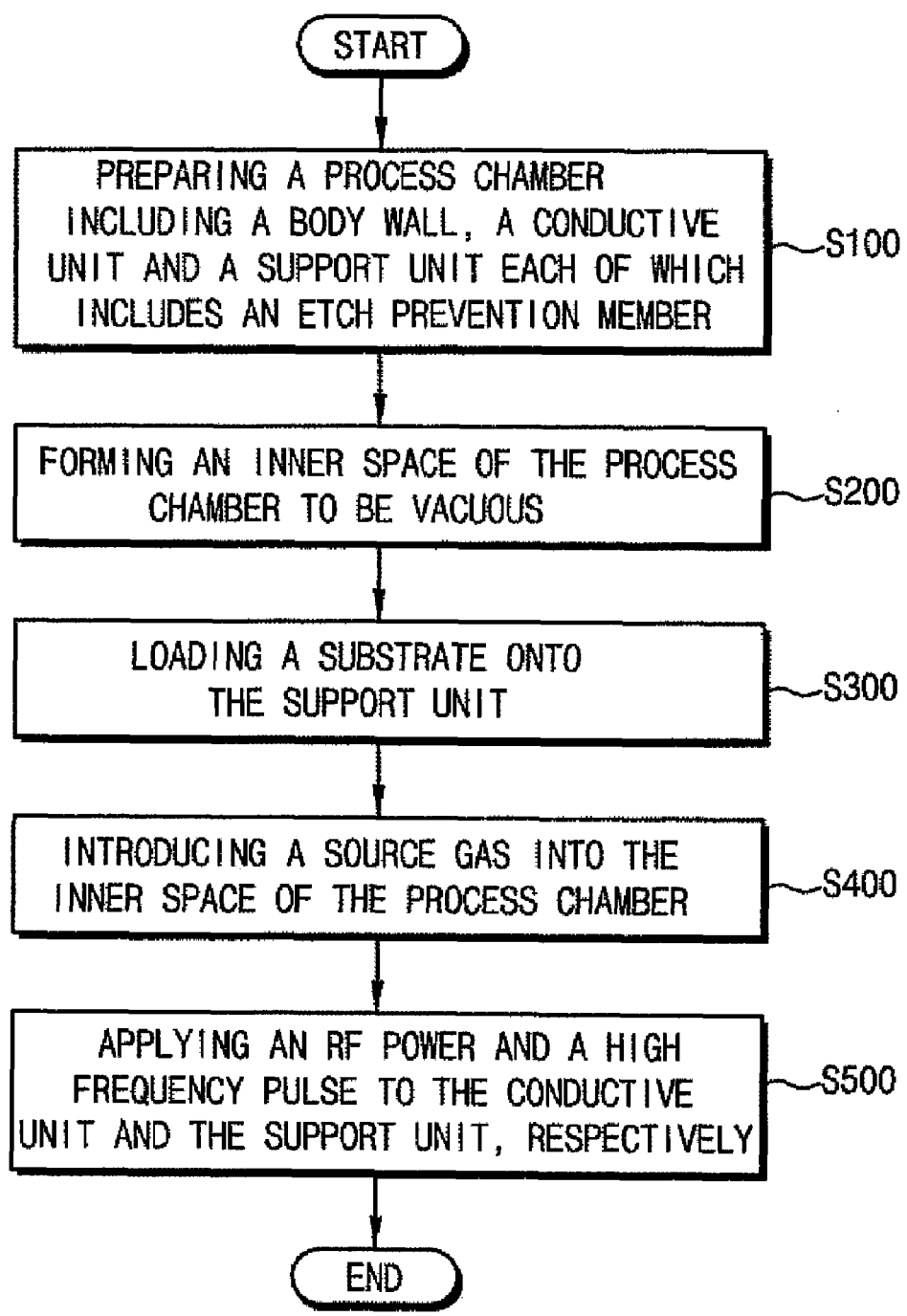
FIG. 4 is a flow chart showing a method of implanting ions into a substrate in the ion implanter shown in FIG. 3.

An exemplary operation of ion implanter 900 according to an embodiment of the invention will now be described with reference to FIGS. 3 and 4. FIG. 4 is a flow chart showing a method of implanting ions into a substrate in the ion implanter shown in FIG. 3.

The apparatus 900 is prepared for doping ions into a substrate, so that the process chamber 100 has the inner space S in which a doping process is performed (step S100). The process chamber 100 includes the body wall 140, the support unit 200, the conductive unit 300, and the power port 400, each of which has the etch prevention member, respectively. The doping apparatus 900 has substantially the same structure as illustrated in FIG. 3, and thus any further detailed descriptions are omitted. The inner space S of the process chamber 100 is formed to be vacuous by discharging gas and byproducts in the process chamber 100 through the exhaust unit 600 (step S200). A semiconductor wafer W is loaded onto the upper surface of platen 220 through port 120 (step S300) and a source gas is introduced into inner space S of process chamber 100 through gas supply unit 500 (step S400). A high voltage pulse is applied to platen 220 by first power source 280, and RF power is applied to conductive unit 300 by second power source 700 (step S500). Then, discharge plasma is formed in inner space S between conductive unit 300 and platen 220, and a plasma sheath is generated around the upper surface of wafer W. In the illustrated embodiment, the RF power is continuously applied from second power source 700, and the discharge plasma is continuously generated in process chamber 100. Since the high voltage pulse is applied to platen 220, positive ions from the plasma are accelerated towards wafer W. The acceleration force is proportional to the voltage difference between platen 220 and conductive unit 300. The implantation depth of the ions is proportional to the voltage applied to process chamber 100. That is, a shallow junction area may be easily and accurately formed in the upper surface of wafer W by controlling the voltage applied to process chamber 100.

According to one embodiment of the invention, the inner surfaces of process chamber 100, including at least platen bushing 240, conductive unit 300 and power port 400 are sufficiently protected from etching by the source gas used in the ion implantation process even where fluorine-based gases are used. Thus, the possibility of aluminum (Al) contaminants being formed on the inner surfaces is minimized.

Using a model ion implantation process, several ion implanters according to the embodiments of the invention were operated under defined test conditions. The resulting quantities of Al contaminants were measured on the upper surface of respective test wafers. A first ion implanter included a quartz liner on the power port an etch prevention member. A second ion implanter included a quartz liner, a silicon plate, and Teflon respectively formed on the power port, the conductive unit, and the platen bushing as etch prevention members. A third ion implanter included a quartz liner, a silicon plate, Kapton tape and Teflon respectively formed on the power port, the conductive unit, the body wall, and the platen bushing etch prevention members.

Using these selected embodiments, the ion implantation process was performed for a batch of wafers without forming any other etching prevention layers on the inner surfaces of the respective process chambers.

Table 2 shows the measured amounts of Al contaminants for respective wafers on which the ion implantation process was performed in the first ion implanter.

TABLE 2

| Wafer Number | Amount of the Al contaminants (E10 atoms/cm2) |
|---|---|
| Wafer 1 | 50.21 |
| Wafer 2 | 16.48 |
| Wafer 3 | 92.39 |

Each of the wafers in Table 2 underwent ion implantation at an electrical power of about 7 kV using boron fluoride (BF3) gas as a source gas. Wafer 1 in Table 2 was the $50^{th}$ wafer on which a first ion implantation process was performed for about 87 seconds at a dosage of about 5E16. Wafer 2 in Table 2 was the $25^{th}$ wafer on which a second ion implantation process was performed for about 3 seconds at a dosage of about 2E15. Wafer 3 in Table 2 was a first wafer on which a third ion implantation process was performed for about 3 seconds at a dosage of about 2E15. For each wafer in Table 2, the amount of Al contaminants was measured using inductively coupled plasma mass spectrometry (ICP-MS).

A comparison of experimental results from Table 2 and Table 1 indicates that the amount of the Al contaminants is remarkably reduced in embodiments of the invention. More particularly, although the ion implantation relative to Wafer 1 was performed for a relatively long time, the amount of the Al contaminants was less than the conventional ion implanter.

Table 3 shows the amounts of Al contaminants measured for wafers on which the ion implantation process was performed using the second ion implanter.

TABLE 3

| Wafer Number | Amount of the Al contaminants (E10 atoms/cm2) |
|---|---|
| Wafer 1 | 21.39 |
| Wafer 2 | 2.09 |
| Wafer 3 | 28.70 |

The respective wafers in Table 3 underwent ion implantation with the same conditions as the wafers in Table 2.

A comparison of the experimental results shown in Table 3 with those of Table 2 indicates that additional etch prevention members associated with the conductive unit and the platen bushing further reduces the occurrence of Al contaminants as compared with the etch prevention member associated with only the power port.

Furthermore, when the ion implantation process was performed on 10 wafers in a wafer cassette, the amount of Al contaminants on the wafer was experimentally verified to be about 10.40E10 atoms/cm2. In contrast, when the ion implantation process was performed on 100 wafers in a wafer cassette, the amount of Al contaminants on the wafer was experimentally verified to be about 7.12E10 atoms/cm2. These experimental results indicate that the amount of Al contaminants is relatively constant despite a change in the wafer stage during the ion implantation. That is, a periodic increase of Al contaminants, which is caused by an incomplete etch prevention against the defining surface of the process chamber, is not observed in an ion implanter according to an embodiment of the invention.

TABLE 4

| Wafer Number | Amount of the Al contaminants (E10 atoms/cm2) |
|---|---|
| Wafer 1 | 4.87 |
| Wafer 2 | 0.81 |
| Wafer 3 | 4.93 |

Each of the respective wafers of Table 4 underwent ion implantation at the same conditions as the wafers in Table 2. A comparison these experimental results with those of Table 1 indicates that etch prevention members associated with the power port, conductive unit, platen bushing and the body wall markedly reduces Al contaminants relative to the conventional ion implanter. Table 4 also indicates that the amount of Al contaminants on Wafer 1 is almost the same as that on Wafer 3. That is, the amount of the Al contaminants on the first wafer is almost the same as that on the $50^{th}$ wafer of an ion implantation process.

Accordingly, the development of Al contaminants may be markedly reduced by the incorporation of one or more etch prevention member(s) into an ion implanter designed to perform an ion implantation process using fluorine-bases gas, such as boron fluoride ($BF_3$) gas, as a source gas without the requirement of forming a protection layer on inner surfaces of the process chamber. Each etch prevention member may be locally positioned on defining surfaces within the inner space of the process chamber to minimize the formation of Al contaminants caused by local etching. That is, each etch prevention member may be variously configured in relation to a defined surface within the inner space of the process chamber in accordance with the processing conditions and characteristics of the ion implantation, so that the benefits of the present invention may be easily provide to a variety of ion implantation processes.

FIG. 5 is a comparative graph showing the amount of Al contaminants for various ion implanters. In region "A" of FIG. 5, an ion implantation process was performed in a conventional ion implanter having a protection layer on inner surfaces of the process chamber. In region "B" of FIG. 5, an ion implantation process was performed in a first ion implanter according to an embodiment of the invention in which a quartz liner is located on the power port as the etch prevention member. In region "C" of FIG. 5, an ion implantation process was performed in a second ion implanter according to an embodiment of the invention in which a quartz liner, a silicon plate and a Teflon liner are located on the power port, on the conductive unit and on the platen bushing as the etch prevention member, respectively. In region "D" of FIG. 5, an ion implantation process was performed in a third ion implanter according to an embodiment of the invention in which a yttrium oxide ($Y_2O_3$) layer, a silicon plate and a Teflon liner are located on the power port, on the conductive unit and on the platen bushing as the etch prevention member, respectively. In region "E" of FIG. 5, an ion implantation process was performed in a fourth ion implanter according to an embodiment of the invention in which a yttrium oxide ($Y_2O_3$) layer, a silicon plate, a Teflon liner and a Kapton liner are located on the power port, on the conductive unit, on the platen bushing and on the inner surface of the body wall as the etch prevention member, respectively.

Referring to FIG. 5, the measured Al contaminants gradually decrease as the ion implanter progresses in its configuration from region "A" to region "E". That is, the etch prevention member on the defined surface of the inner space of the process chamber may sufficiently decrease the Al contaminants in the ion implanter without any protection layer on the inner surface of the process chamber. Furthermore, the processing time for regions "B" to region "E" will be shorter than that in region "A", so that the processing time of an ion implanter according to an embodiment of the invention will be shorter than that of the conventional ion implanter. This reduction in processing time is caused by skipping the step of forming the protection layer on the inner surface of the process chamber.

Although the exemplary embodiments of the present invention have been described, it is understood that the present invention should not be limited to these exemplary embodiments but various changes and modifications can be made by one skilled in the art within the scope of the present invention as hereinafter claimed.

What is claimed is:

1. An apparatus for doping ions into a substrate, comprising:
    a process chamber having an inner space in which an ion implantation process is performed;
    a support unit positioned in the process chamber, supporting a substrate and being electrically connected to a first power source for generating a high frequency pulse;
    a conductive unit separated from the support unit in such a manner that plasma associated with the ion implantation process is generated between the support unit and the conductive unit, wherein the conductive unit comprises a first etch prevention member preventing the conductive unit from being etched by a source gas used to generate the plasma; and
    a power port electrically connected to a second power source and generating radio frequency (RF) power applied to the conductive unit.

2. The apparatus of claim 1, wherein the conductive unit is formed from aluminum (Al) and is electrically grounded through the process chamber, such that secondary ions generated during the ion implantation process are discharged into the process chamber through the conductive unit.

3. The apparatus of claim 2, wherein the first etch prevention member comprises at least one of a silicon plate, a silicon plate comprising a silicon-based material and conductive particles, and a silicon plate comprising a silicon-based material and aluminum particles formed on a surface of the conductive unit.

4. The apparatus of claim 2, wherein the first etch prevention member comprises at least one of a silicon layer, a diamond-like carbon (DLC) layer, and a graphite layer formed on a surface of the conductive unit.

5. The apparatus of claim 1, wherein the power port is formed from aluminum oxide and comprises a second etch prevention member preventing the power port from being etched by the source gas.

6. The apparatus of claim 5, wherein the second etch prevention member comprises a liner associated with the power port, the liner being from at least one material including silicon, quartz, and aluminum nitride.

7. The apparatus of claim 6, wherein the liner comprises quartz and has a dielectric constant substantially the same as the power port.

8. The apparatus of claim 5, wherein the second etch prevention member comprises a thin layer formed from at least one of yttrium oxide, pour-free aluminum oxide, and silicon.

9. The apparatus of claim 1, wherein the process chamber is formed from aluminum, and further comprises a third etch prevention member preventing the process chamber from being etched by the source gas.

10. The apparatus of claim 9, wherein the third etch prevention member comprises a liner associated with the process chamber and a thin layer formed on the liner.

11. The apparatus of claim 10, wherein the liner comprises aluminum, and the thin layer comprises at least one of silicon, yttrium oxide, and an anodized oxide.

12. The apparatus of claim 9, wherein the liner comprises polyimide.

13. The apparatus of claim 1, wherein the support unit comprises a platen on which the substrate is positioned and a platen bushing isolating the platen from the source gas and securing the platen to the process chamber.

14. The apparatus of claim 13, wherein the platen bushing is formed from aluminum oxide and further comprises a fourth etch prevention member preventing the platen bushing from being etched by the source gas.

15. The apparatus of claim 14, wherein the fourth etch prevention member comprises a quartz liner associated with the platen bushing.

16. The apparatus of claim 14, wherein the fourth etch prevention member comprises a diamond-like carbon (DLC) layer formed on a surface of the platen bushing.

17. The apparatus of claim 1, wherein the source gas comprises a fluorine-based gas.

18. The apparatus of claim 17, wherein the fluorine-based gas includes boron fluoride gas.

19. An apparatus for doping ions into a substrate, comprising:
    a process chamber having an inner space in which an ion implantation process is performed and comprising a first etch prevention member preventing the process chamber from being etched by a source gas associated with the ion implantation process;
    a support unit positioned in the process chamber, supporting a substrate, and being electrically connected to a first power source for generating a high frequency pulse;

a conductive unit separated from the support unit across the inner space and comprising a second etch prevention member preventing the conductive unit from being etched by the source gas; and a power port electrically connected to a second power source generating RF power applied to the conductive unit and comprising a third etch prevention member preventing the power port from being etched by the source gas.

20. The apparatus of claim 19, wherein the process chamber is formed from aluminum (Al), and the first etch prevention member comprises a liner associated with the process chamber and a thin layer formed on a surface of the liner.

21. The apparatus of claim 20, wherein the liner comprises aluminum, and the thin layer comprises at least one of silicon, yttrium oxide, and an anodized oxide.

22. The apparatus of claim 19, wherein the conductive unit is formed from aluminum (Al) and is electrically grounded through the process chamber, such that secondary ions generated during the ion implantation process are discharged into the process chamber through the conductive unit.

23. The apparatus of claim 22, wherein the second etch prevention member comprises a silicon plate formed on a surface of the conductive unit, wherein the silicon plate comprises a silicon-based material and conductive particles.

24. The apparatus of claim 19, wherein the third etch prevention member comprises a quartz liner having a dielectric constant substantially the same as the power port.

25. The apparatus of claim 19, wherein the support unit comprises a platen on which the substrate is positioned and a platen bushing isolating the platen from the source gas and securing the platen to the process chamber.

26. The apparatus of claim 25, wherein the platen bushing is formed from aluminum oxide and further comprises a fourth etch prevention member preventing the platen bushing from being etched by the source gas.

27. The apparatus of claim 26, wherein the fourth etch prevention member comprises a quartz liner.

28. The apparatus of claim 19, wherein the source gas includes a fluorine-based gas.

29. A method of doping ions into a substrate, comprising:
preparing a process chamber having an inner space in which a doping process is performed, the process chamber including a conductive unit having a first etch prevention member and electrically connected to a first power source for generating radio frequency (RF) power, and a support unit having a second etch prevention member at a peripheral portion thereof and electrically connected to a second power source for generating a high frequency pulse, the process chamber having a third etch prevention member along a body wall that defines the inner space therein;

loading the substrate onto the support unit;

introducing a source gas into the inner space of the process chamber;

applying the RF power to the conductive unit and the high frequency pulse to the support unit, so that the source gas is transformed into plasma and doped into the substrate without an etching against the body wall of the process chamber, the conductive unit and the support unit.

30. The method of claim 29, wherein the body wall of the process chamber further includes a power port that is electrically connected to the first power source and has a fourth etch prevention member, so that the power port is prevented from being etched in a doping process.

31. The method of claim 29, before loading the substrate, further comprising forming the inner space of the process chamber to be vacuous by discharging gas and byproducts in the process chamber through an exhaust unit.

* * * * *